(12) United States Patent
Light et al.

(10) Patent No.: US 8,845,908 B2
(45) Date of Patent: Sep. 30, 2014

(54) RETICLES, AND METHODS OF MITIGATING ASYMMETRIC LENS HEATING IN PHOTOLITHOGRAPHY

(75) Inventors: Scott L. Light, Boise, ID (US); Dan Millward, Boise, ID (US); Yuan He, Boise, ID (US); Kaveri Jain, Boise, ID (US); Lijing Gou, Boise, ID (US); Zishu Zhang, Boise, ID (US); Anton deVilliers, Boise, ID (US); Michael Hyatt, Boise, ID (US); Jianming Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/862,524

(22) Filed: Aug. 24, 2010

(65) Prior Publication Data

US 2012/0052416 A1    Mar. 1, 2012

(51) Int. Cl.
*G03F 1/38*     (2012.01)
*G03F 7/20*     (2006.01)

(52) U.S. Cl.
CPC ............ *G03F 1/38* (2013.01); *G03F 7/70433* (2013.01); *G03F 7/70891* (2013.01)
USPC ................................. 216/12; 430/5

(58) Field of Classification Search
CPC .................... G03F 1/36; G03F 1/38

USPC ............................................. 216/12
See application file for complete search history.

(56) References Cited

U.S. PATENT DOCUMENTS

| | | | |
|---|---|---|---|
| 5,723,238 A | 3/1998 | Moore et al. | |
| 5,888,675 A | 3/1999 | Moore et al. | |
| 6,841,310 B2 | 1/2005 | Dulman | |
| 2006/0292456 A1 | 12/2006 | Baluswamy | |
| 2007/0287075 A1* | 12/2007 | Pforr et al. | 430/5 |
| 2008/0239272 A1 | 10/2008 | Wang et al. | |
| 2009/0239162 A1 | 9/2009 | Yang | |
| 2009/0244502 A1 | 10/2009 | Kuechler et al. | |
| 2009/0296055 A1 | 12/2009 | Ye et al. | |

* cited by examiner

*Primary Examiner* — Mark F Huff
*Assistant Examiner* — John S Ruggles
(74) *Attorney, Agent, or Firm* — Wells St. John P.S.

(57) ABSTRACT

A method of mitigating asymmetric lens heating in photolithographically patterning a photo-imagable material using a reticle includes determining where first hot spot locations are expected to occur on a lens when using a reticle to pattern a photo-imagable material. The reticle is then fabricated to include non-printing features within a non-printing region of the reticle which generate additional hot spot locations on the lens when using the reticle to pattern the photo-imagable material. Other implementations are contemplated, including reticles which may be independent of method of use or fabrication.

24 Claims, 13 Drawing Sheets

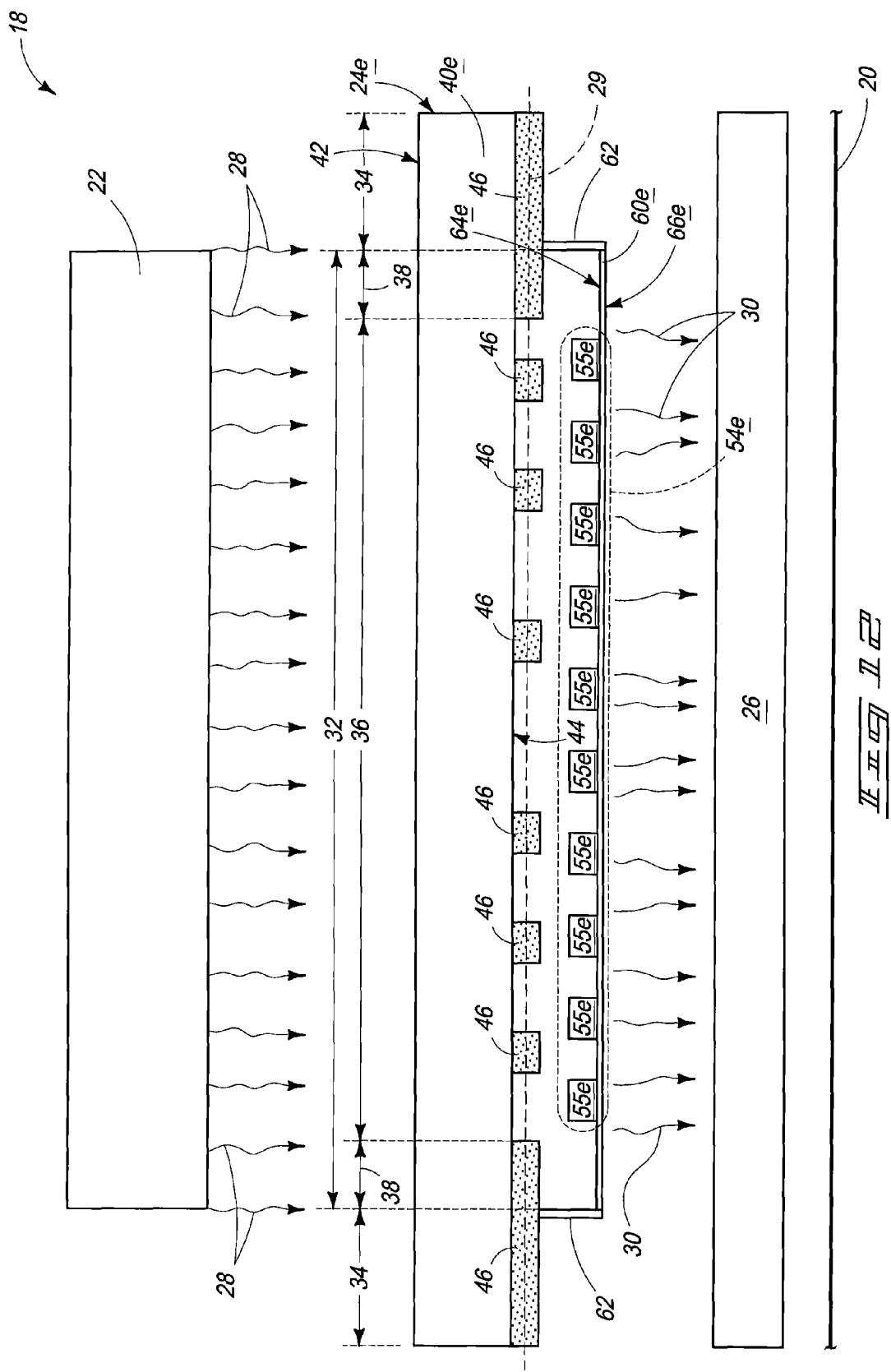

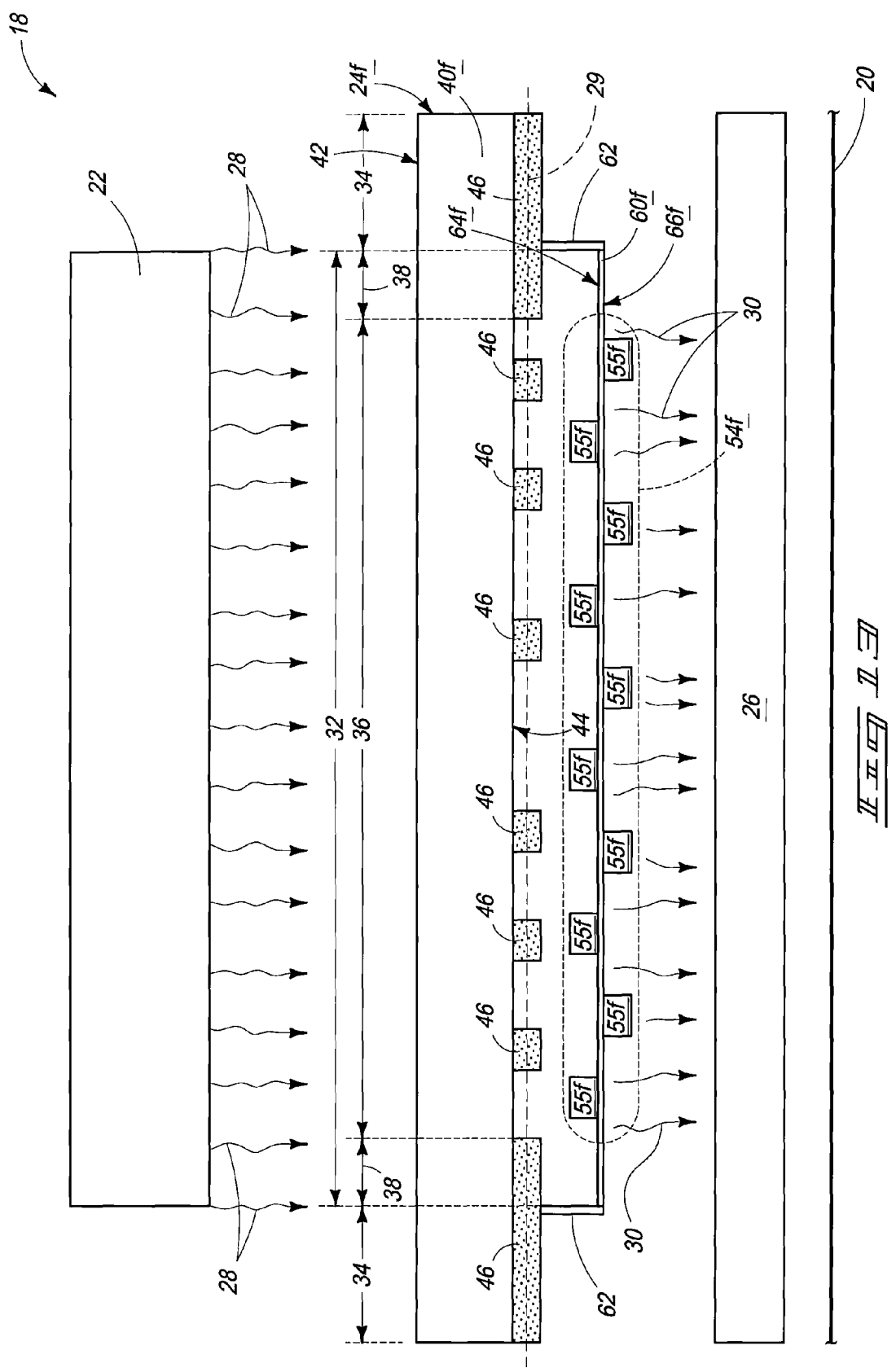

RETICLES, AND METHODS OF MITIGATING ASYMMETRIC LENS HEATING IN PHOTOLITHOGRAPHY

TECHNICAL FIELD

Embodiments disclosed herein pertain to asymmetric lens heating in photolithographically patterning a substrate using a reticle, and to reticles which may be independent of method of use or fabrication.

BACKGROUND

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" traditionally being understood to refer to masks which define a pattern for an entirety of a wafer, and the term "reticle" traditionally being understood to refer to a patterning tool which defines a pattern for only a portion of a wafer. However, the terms "photomask" (or more generally "mask") and "reticle" are frequently used interchangeably so that either term can refer to a radiation-patterning tool that encompasses either a portion or an entirety of a wafer.

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer to be patterned is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implanting or etching relative to materials on the wafer proximate the photoresist.

In patterning photoresist, the patterned radiation emitted from the reticle passes through optics comprising one or more lenses and then onto the photoresist. As any one of the individual lens receives impinging radiation, it will begin to heat. If this radiation is directed to only certain points on the lens (either symmetrically or asymmetrically) and the thermal conductivity of the lens material is too low to distribute the heat load uniformly across the lens within the timeframe of the radiation exposure, then the lens will distort due to thermal expansion of the lens material in more heated regions relative to less heated regions. This results in optical aberrations when the distortion becomes significant. One manner of compensating for this is to impinge radiation more uniformly across the lens so that the heat load is distributed uniformly within the timeframe of the radiation exposure.

However, needs remain for improved methods of mitigating asymmetric lens heating in photolithographically patterning a photoresist using a reticle.

BRIEF DESCRIPTION OF THE DRAWINGS

FIG. 12 is a diagrammatic sectional view of the FIG. 4 apparatus incorporating another embodiment reticle in accordance with the invention.

FIG. 13 is a diagrammatic sectional view of the FIG. 4 apparatus incorporating another embodiment reticle in accordance with the invention.

DETAILED DESCRIPTION OF EXAMPLE EMBODIMENTS

Embodiments of the invention include methods of mitigating asymmetric lens heating in photolithography. In one embodiment, it is determined where first hot spot locations are expected to occur on a lens when using a reticle to photo-pattern a substrate. Then, the reticle is fabricated to include non-printing features within a non-printing region of the reticle which generate additional hot spot locations on the lens when using the reticle to photo-pattern the substrate.

Figure 1:
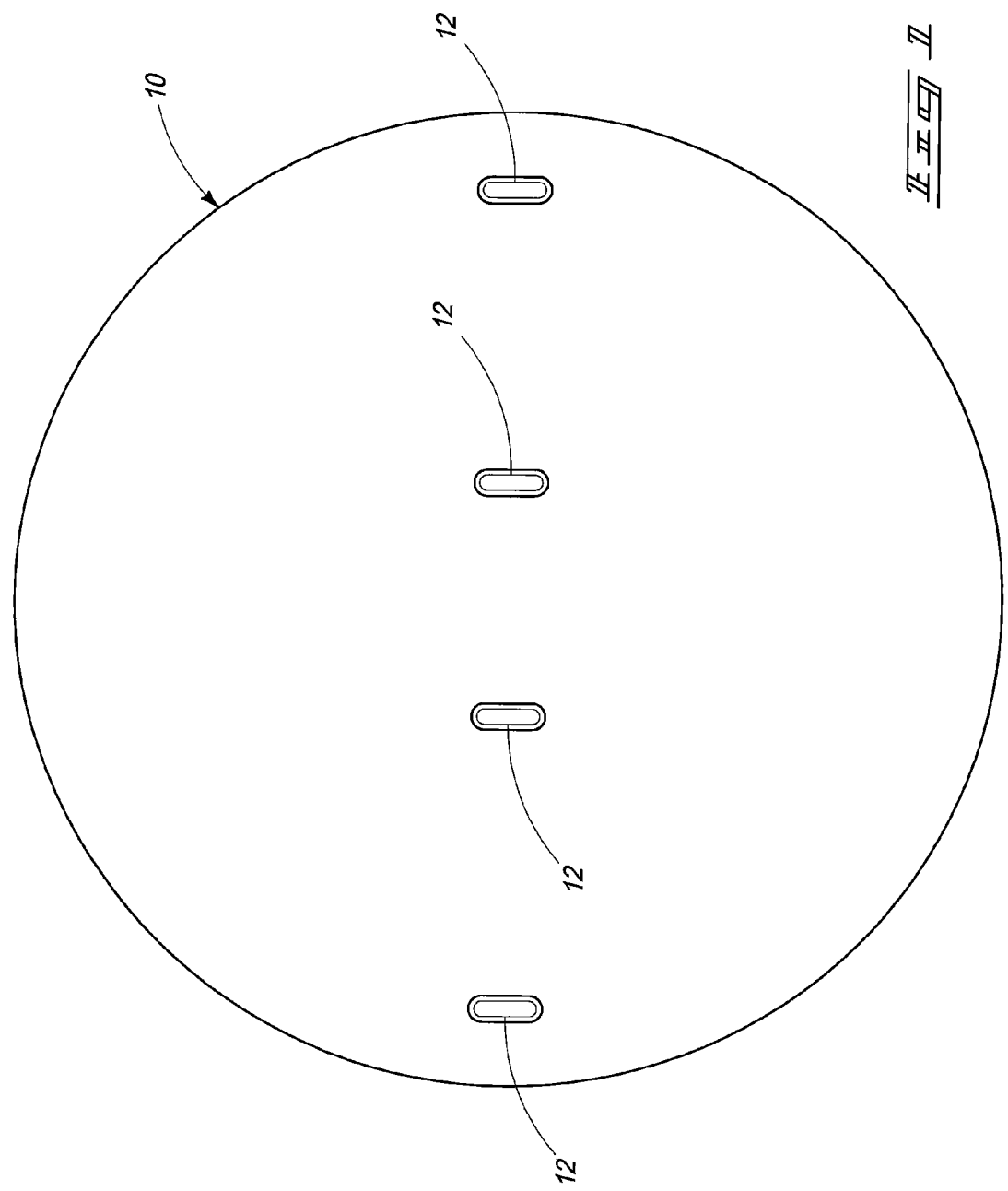
FIG. 1 is a diagrammatic top-down view representing lens heating.

For example, consider FIG. 1 which is a diagrammatic top-down signature plot of determined hot spot locations which are expected to occur across a lens depicted by outline 10 when using some reticle (not shown) to photo-pattern a substrate. In the context of this document, the term "lens" is an optical element of an optical system which transfers a pattern from a reticle to a substrate that includes one or more radiation transmissive elements or one or more reflective elements. Accordingly, the term "lens" encompasses reflective as well as radiation transmissive optical elements. Incident radiation would be passed through a reticle and then into an optic system containing a lens 10, and therefrom out of the optic system and onto a substrate (not shown) to form a pattern on the substrate. It has been determined that hot spot locations 12 are expected to occur on lens 10 when using the particular reticle. For convenience, and to distinguish from other hot spot locations referred to below, the FIG. 1 depicted locations are referred to as first hot spot locations 12 hereafter. Such may or may not be of common size and/or shape, and may or may not be somewhat symmetrically arranged with respect to each other. Further, first hot spot locations may or may not be of the same intensity relative one another. Regardless, FIG. 1 represents an example overall asymmetric heating of lens 10 the result of hotter locations 12 in comparison to other depicted locations on lens 10. Further, such areas of lens 10 outside of locations 12 may or may not be of uniform temperature upon operation of an optic system within which lens 10 is received when using the reticle and optic system for patterning a substrate. Regardless, different reticles, different wavelength and/or dose of incident radiation will most likely produce slightly or significantly different heat signatures from that shown in FIG. 1.

Figure 2:
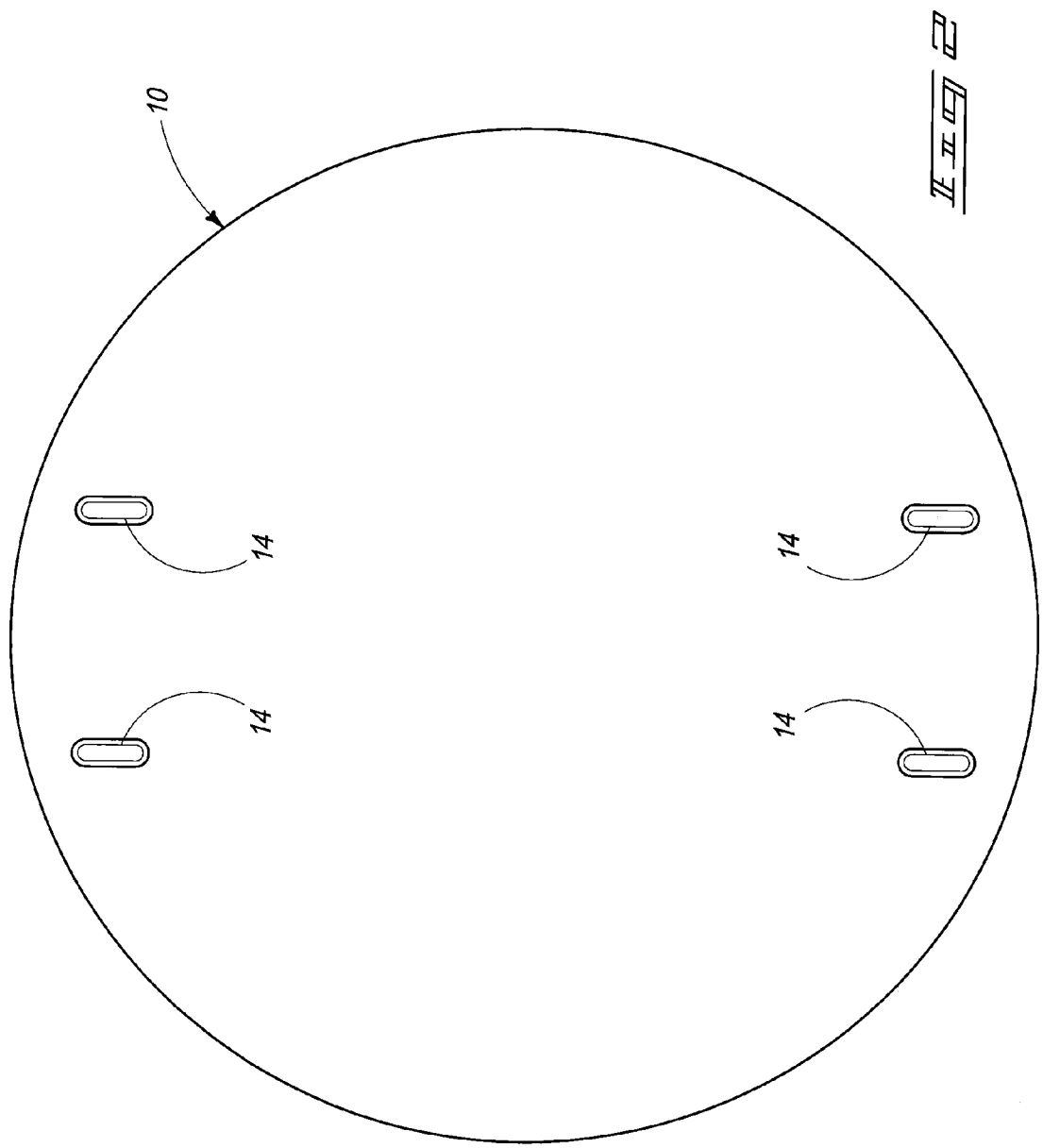
FIG. 2 is a diagrammatic top-down view representing added lens heating.

FIG. 2 shows example additional or second hot spot locations 14 which, by way of example only, if provided when combined with first hot spot locations 12 may result or at least contribute to more uniform heat distribution across lens 10. For example, FIG. 3 depicts a composite/combination of FIGS. 1 and 2 showing lens 10 encompassing first hot spot locations 12 and additional hot spot locations 14 whereby, in one implementation, asymmetric lens heating has been mitigated by having the collective hot spot locations more uniformly distributed across the lens.

In accordance with an embodiment of the invention, the particular reticle which is used is fabricated to include non-printing features within a non-printing region of the reticle which generate the additional hot spot locations on the lens when using the fabricated reticle to photo-pattern the substrate.

The locations of first hot spot locations 12 can be determined by prediction for a given semiconductor process. The determined predictions can be based on, for example, calculations based on the various parameters that would be used during the photolithographic processing. Alternately or additionally, actual experiments may be conducted using the particular reticle in a processing apparatus in processing a substrate. Accordingly, the size, shape, positioning, and quantity of the non-printing features within a non-printing region of the reticle may be determined based upon one or both of calculations or actual experiments. For example, suitable software for such determinations and modeling include simulation tools which include lens modeling software and/or mask preparation software available from numerous manufacturers, for example Synopsis, Inc., Mentor Graphics Inc., ASML Inc. by ways of example only.

Figure 3:
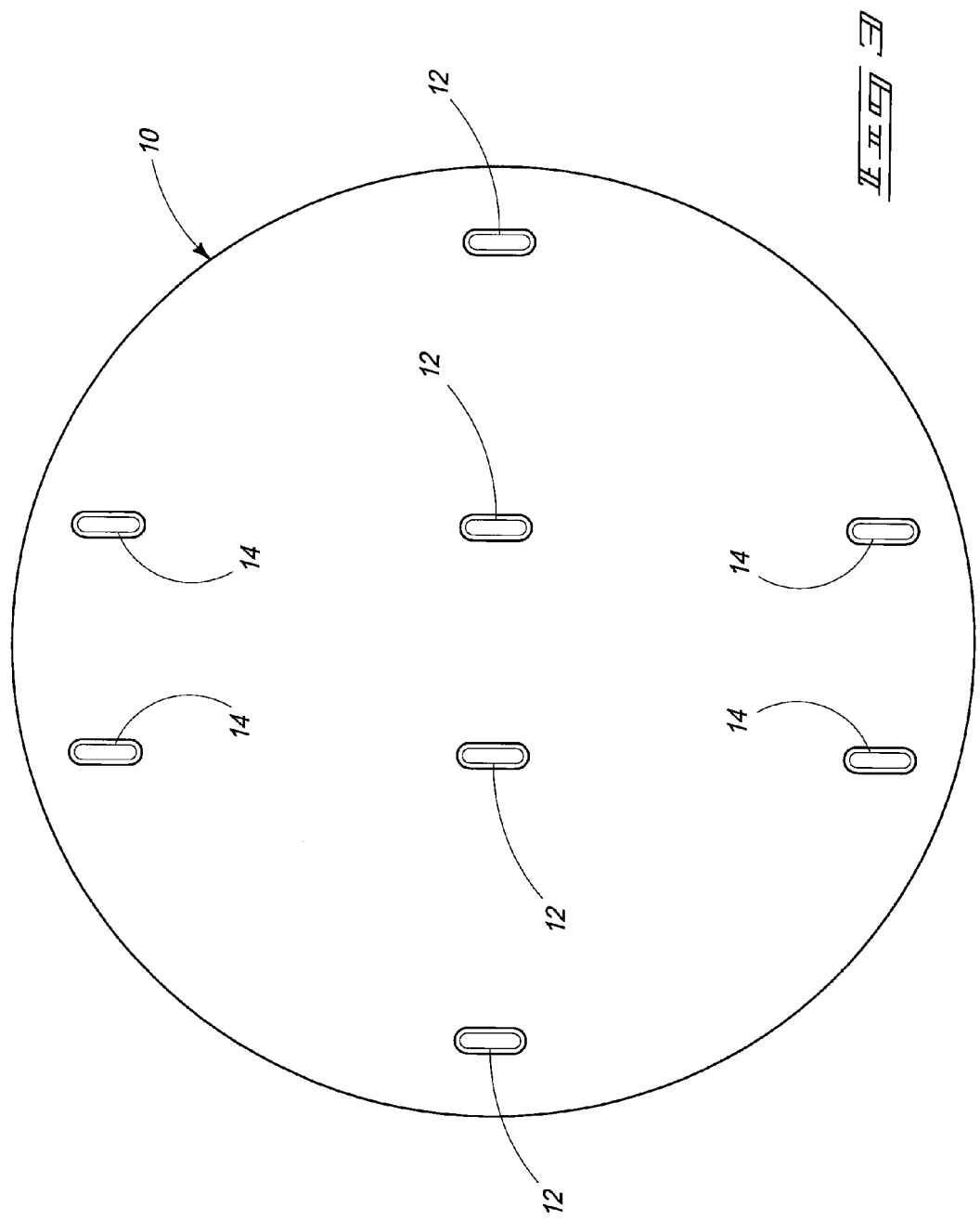
FIG. 3 is a composite/combination of FIGS. 1 and 2.

FIG. 3 depicts an example wherein additional hot spot locations 14 which mitigate asymmetric lens heating are everywhere spaced from first hot spot locations 12. Alternately, but likely less desirable, the first and additional hot spot locations might overlap to some degree.

Figure 4:
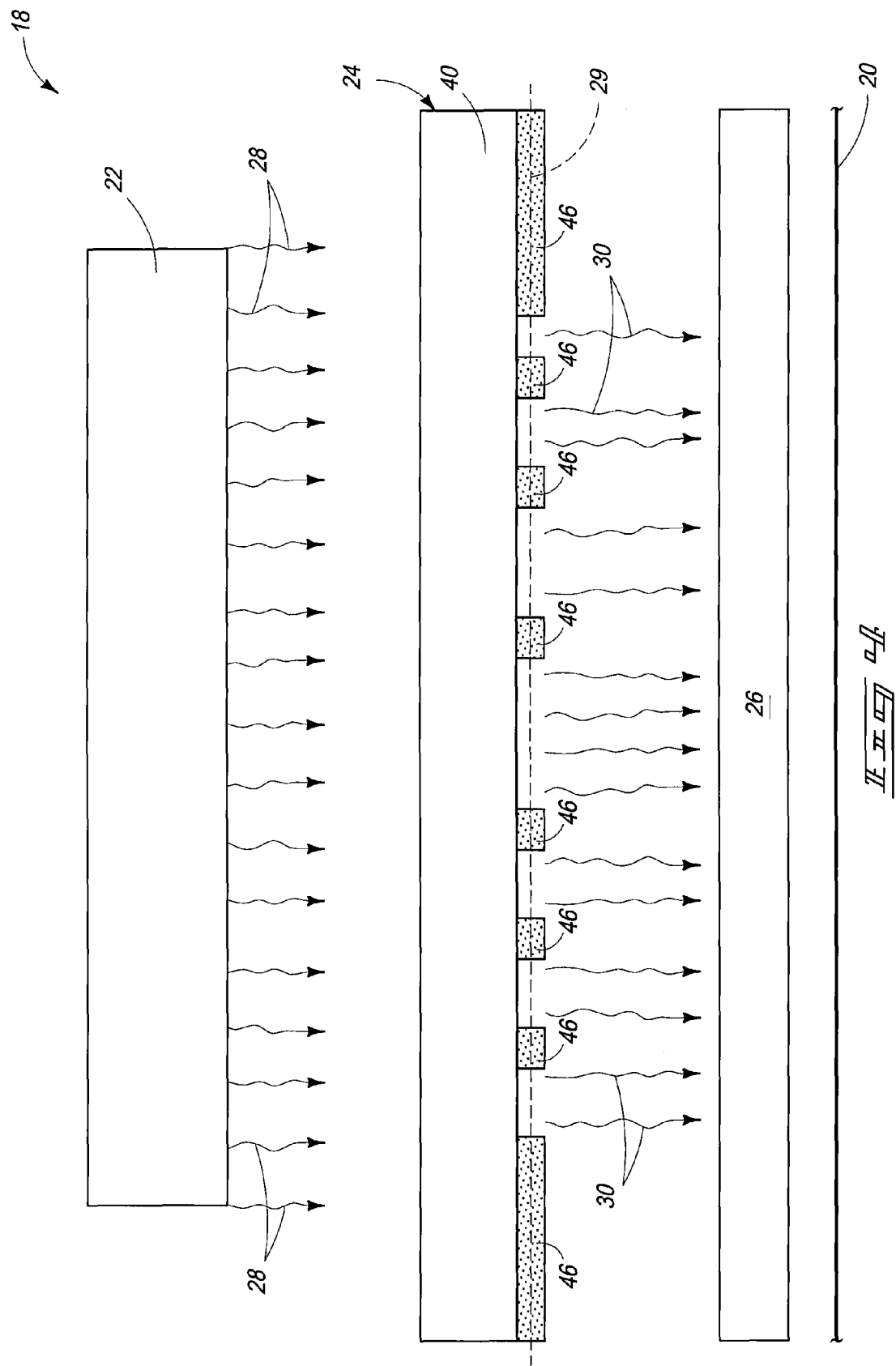
FIG. 4 is a diagrammatic sectional view of an apparatus that may be used in method embodiments of the invention, and with a reticle thereof as taken through line 4-4 in FIG. 5.

An example implementation is next described with reference to FIGS. 4-7. FIG. 4 is a highly diagrammatic layout of components of an apparatus which may be used to photolithographically pattern a substrate 20. Such may comprise a photoimageable material (not shown) sensitive to the radiation used. In one implementation, substrate 20 comprises a semiconductive substrate. In the context of this document, the term "semiconductor substrate" or "semiconductive substrate" is defined to mean any construction comprising semi-conductive material, including, but not limited to, bulk semi-conductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The photoimageable material may comprise, consist essentially of, or consist of one or more photoresists or other patternable material whether existing or yet-to-be developed.

Figure 5:
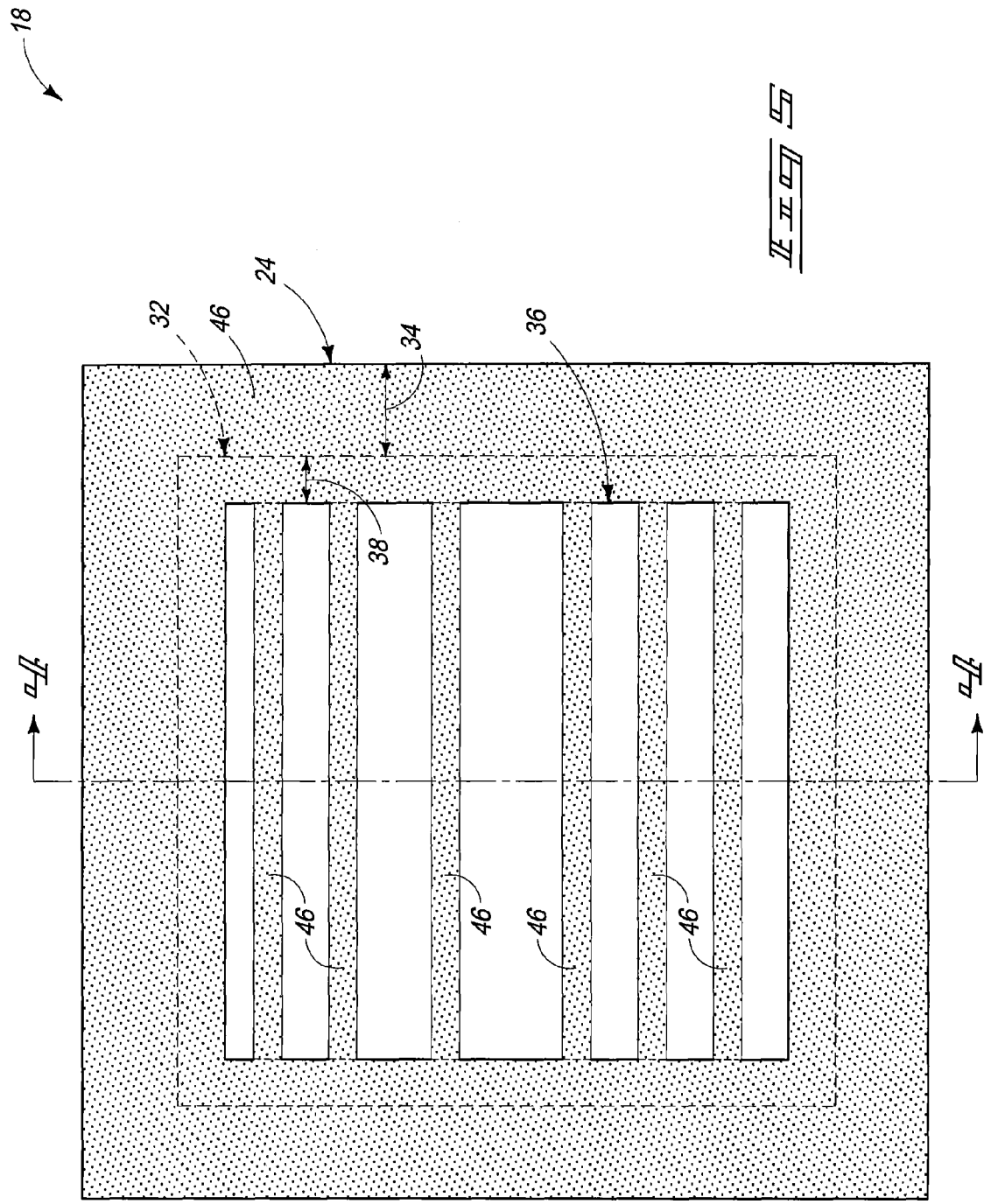
FIG. 5 is a diagrammatic bottom-up view of the reticle of FIG. 4.
Figure 6:
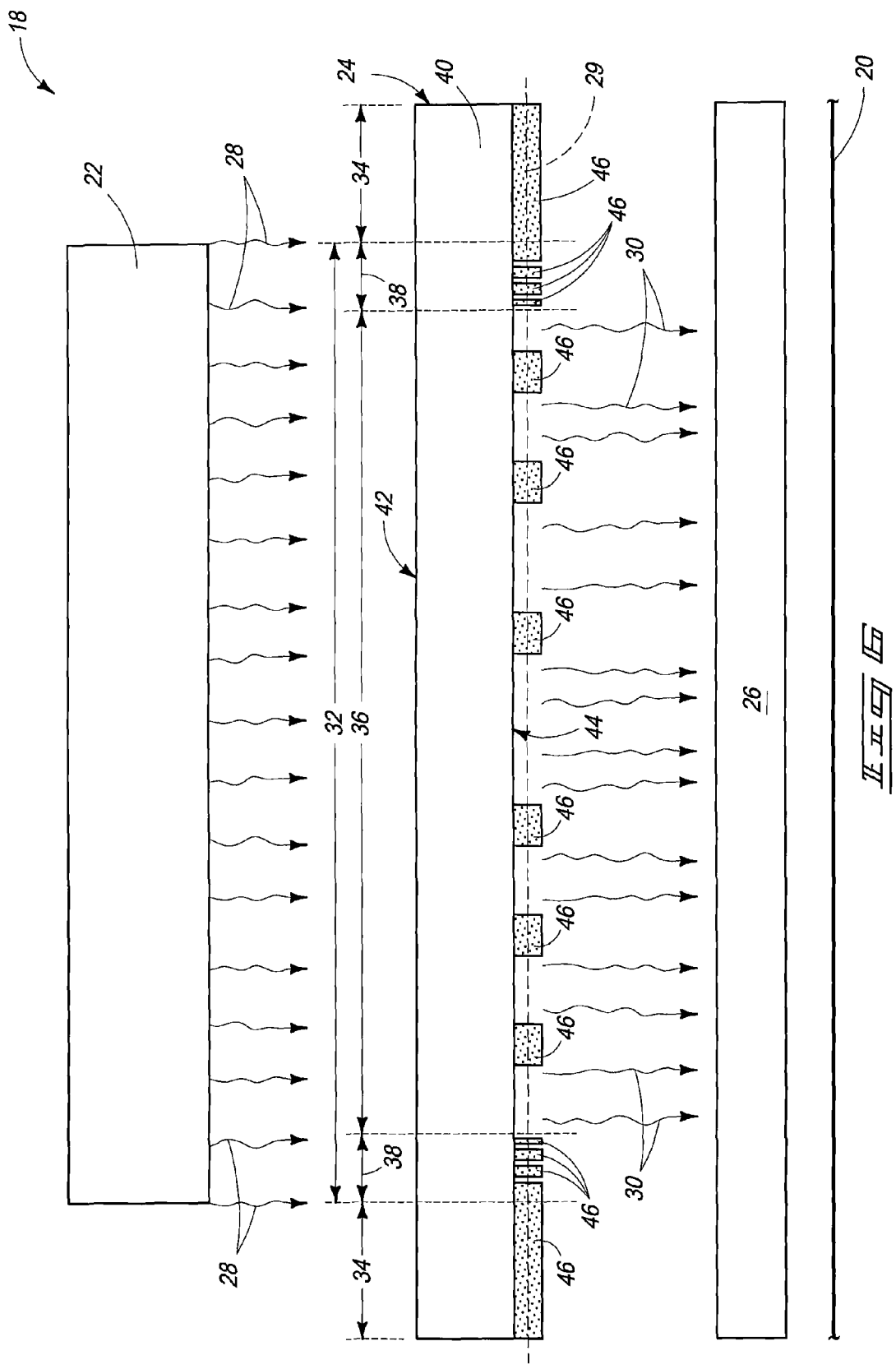
FIG. 6 is a diagrammatic sectional view of the FIG. 4 apparatus incorporating a reticle in accordance with embodiments of the invention, and with a view of the reticle taken through line 6-6 in FIG. 7.
Figure 7:
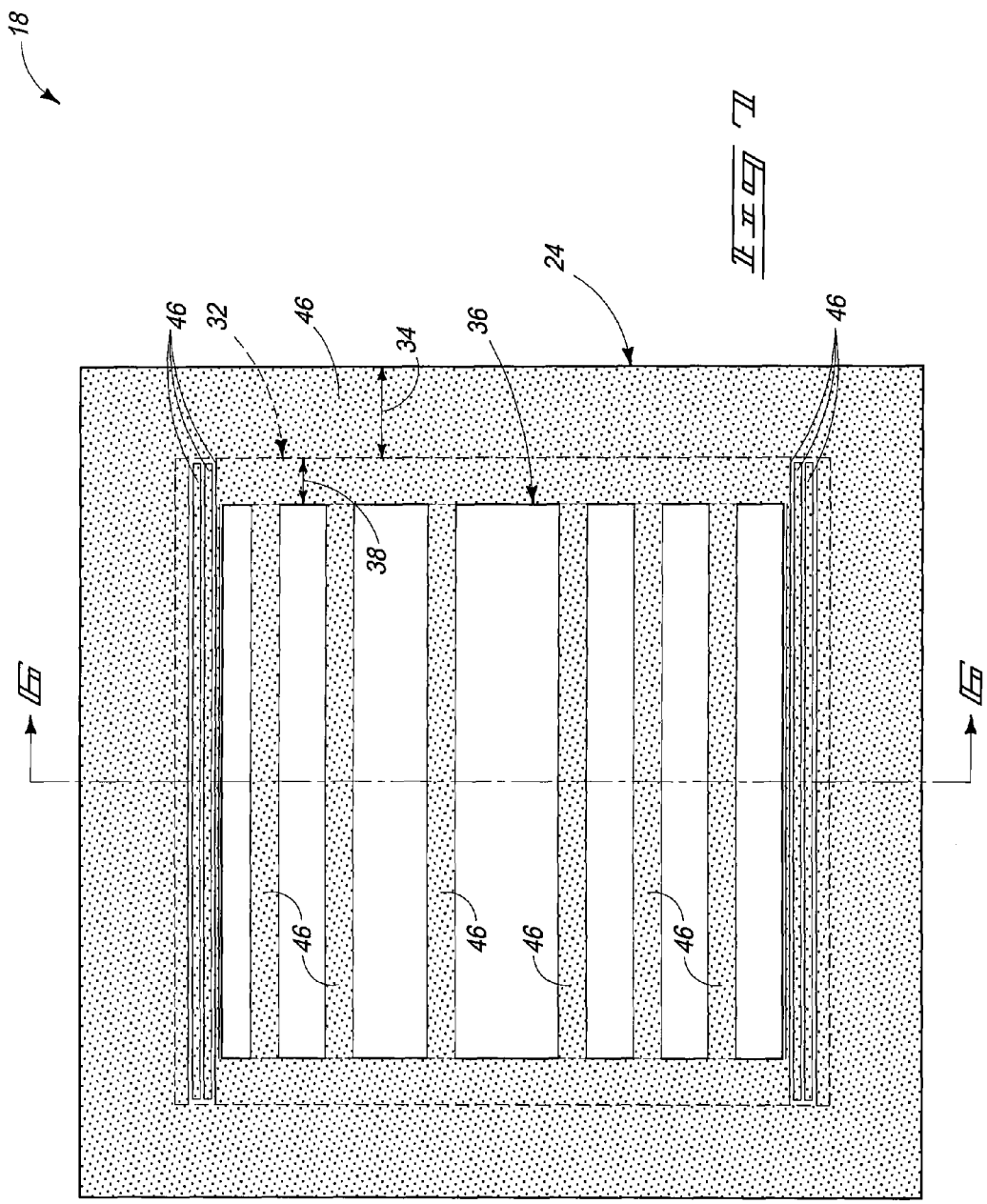
FIG. 7 is a diagrammatic bottom-up view of the reticle of FIG. 6.

Equipment or apparatus 18 includes a suitable radiation projector 22, a reticle 24, and an optic system 26. Projector 22 emits incident radiation 28 to reticle 24. Reticle 24 emits patterned radiation 30 which passes through optic system 26 within which at least one lens is received and through which the patterned radiation 30 is ultimately projected onto an outermost surface of substrate 20. FIGS. 4 and 5 diagrammatically depict a reticle 24 as would be constructed or modeled prior to fabrication which would include non-printing features within a non-printing region of such reticle which would generate additional hot spot location on the particular lens within optic system 26 when using reticle 24 to photo-pattern substrate 20. FIGS. 6 and 7 diagrammatically depict an example reticle which has been fabricated to include non-printing features within a non-printing region of the reticle which will generate such additional hot spot locations on the lens.

Regardless, referring to FIGS. 4-7, reticle 24 may be considered as comprising a focal plane 29 which is an idealized positioning plane for reticle 24 relative to optic system 26 for obtaining acceptable focus of the patterned radiation 30 at the surface of substrate 20 upon passing through optic system 26. Focal plane 29 for a given reticle is typically the plane passing through the mid-thickness point of opaque features (described below) that are received upon and project from one side of the reticle. Of course, acceptable focus onto substrate 20 may result within a small range of distance variance between reticle 24 and optic system 26 such that focal plane 29 may not be infinitely thin, and thereby have some thickness. Regardless, reticle 24 comprises a reticle field area 32 within reticle focal plane 29 and upon which incident radiation 28 is projected. In the context of this document, the reticle field area is that continuous area onto which incident radiation 28 is projected onto the reticle. An area 34 outside of and peripheral to reticle field area 32 may be effectively opaque to transmission of incident radiation for patterning onto substrate 20. Peripheral area 34 may include alignment or other marks transmissive of incident radiation for purposes of aligning reticle 24 within system/apparatus 18.

Reticle field area 32 includes a live pattern area 36 within focal plane 29 from which patterned radiation 30 is emitted to print features on substrate 20. Live pattern area 36 is that continuous area through and from which radiation passes to form the actual printed features onto substrate 20. It includes that area often referred to as "clear surrounding" or "dark surrounding" of an array pattern which is received radially inward of the "clear surrounding" or the "dark surrounding". Such "clear surrounding" and "dark surrounding" are part of the printing region of the reticle. Live pattern area does not encompass the typical opaque peripheral border area, which is commonly referred to as the "chrome border". Reticle field area 32 comprises a border area 38 within reticle focal plane 29 upon which incident radiation is projected and which constitutes a non-printing region of reticle 24. To achieve illumination of border area 38 with incident radiation, one may move the reticle blades of the optical equipment radially outward to radially expand the incident radiation so it will impinge onto border area 38. In one embodiment, border area 38 surrounds live pattern area 36. Alternately by way of example, the border area may not surround the live pattern area and only be received continuously or discontinuously along a portion thereof. Regardless, the border area constitutes a non-printing region of the reticle within reticle field area 32. Historically, the border area constitutes a totally opaque non-printing region in dark field reticles or a totally clear non-printing region in clear field reticles as no incident radiation is projected onto such border area. In the embodiment of FIGS. 6 and 7, it is within border area 38 within which the non-printing features are fabricated within the focal plane to produce such additional hot spot locations.

Specifically referring to FIGS. 6 and 7, in one embodiment, reticle 24 comprises a radiation transmissive core 40, for example, quartz. Transmissive core 40 may be considered as having incident radiation side surface 42 and emitted radiation side surface 44 which oppose one another. In the FIGS. 6 and 7 embodiment, the printing features and the non-printing features have been fabricated on emitted radiation side 44. Alternately, the printing features and the non-printing features may be fabricated more proximate incident radiation side 42. Regardless, in one embodiment, the printing features and the non-printing features may be fabricated using an opaque material 46, for example chrome. In the FIGS. 6 and 7 embodiment, opaque material 46 has been used to form printing/printable features within live pattern area 36, non-printing features within border area 38, and effectively mask radiation from being transmitted through peripheral area 34. The non-printing features within border area 38 are of sub-resolution size so they will not print on substrate 20.

FIGS. 6 and 7 diagrammatically depict opaque masking blocks within live pattern area 36 which will result in features (not shown) that print on substrate 20. Depending in part upon whether positive or negative photoresist is used, the depicted blocks of material 46 within live pattern area 36 may be considered as printing features (meaning features that will print) of reticle 24, or alternately the space between the blocks of material 46 within live pattern area 36 may considered as printing features. Analogously, the blocks of opaque material 46 within border area 38, or the space between the blocks of material within border area 38, may be considered as constituting non-printing features of reticle 24. Regardless, in one embodiment, the non-printing features of sub-resolution size include straight walls that are orthogonal to the bulk of transmissive core 40. In one embodiment, the non-printing features are substantially incident radiation transparent, with the border area being substantially opaque to incident radiation but for the non-printing substantially transparent features which allow the incident radiation to pass there-through. For example, the depicted spaces between the blocks of opaque masking material 46 within border area 38 may be considered as example such substantially incident radiation transparent non-printing features. Alternately, by way of example only, the non-printing features may be substantially opaque to incident radiation. In an example dark field reticle, and as shown, the non-printing features would be the openings/spaces through opaque material 46. In a clear field reticle, the non-printing features would be the opaque material as opposed to the openings/spaces.

Regardless, in one embodiment, the non-printing features received within the border area may entirely surround (not shown) the live pattern area or alternately be received within isolated areas which collectively do not entirely surround the live pattern area, for example as shown. Further and regardless, the non-printing features within border area 38 may be of different size (as shown) and/or shape, or of common size and/or shape.

The above example embodiments were described in connection with fabrication of a binary mask/reticle using opaque material. Alternately or additionally, attenuated phase shift mask processing or chromeless lithography might be used.

Embodiments of the invention also encompass fabricating the reticle to have the non-printing region within which the non-printing features are fabricated to be outside of the reticle focal plane. In one embodiment, closest surfaces of material from which the non-printing features are fabricated are spaced at least 0.75 micron, and in one embodiment at least 1.0 micron, perpendicularly away from the reticle focal plane. Regardless, examples of such embodiments are next described with reference to FIGS. 8-13.

Figure 8:
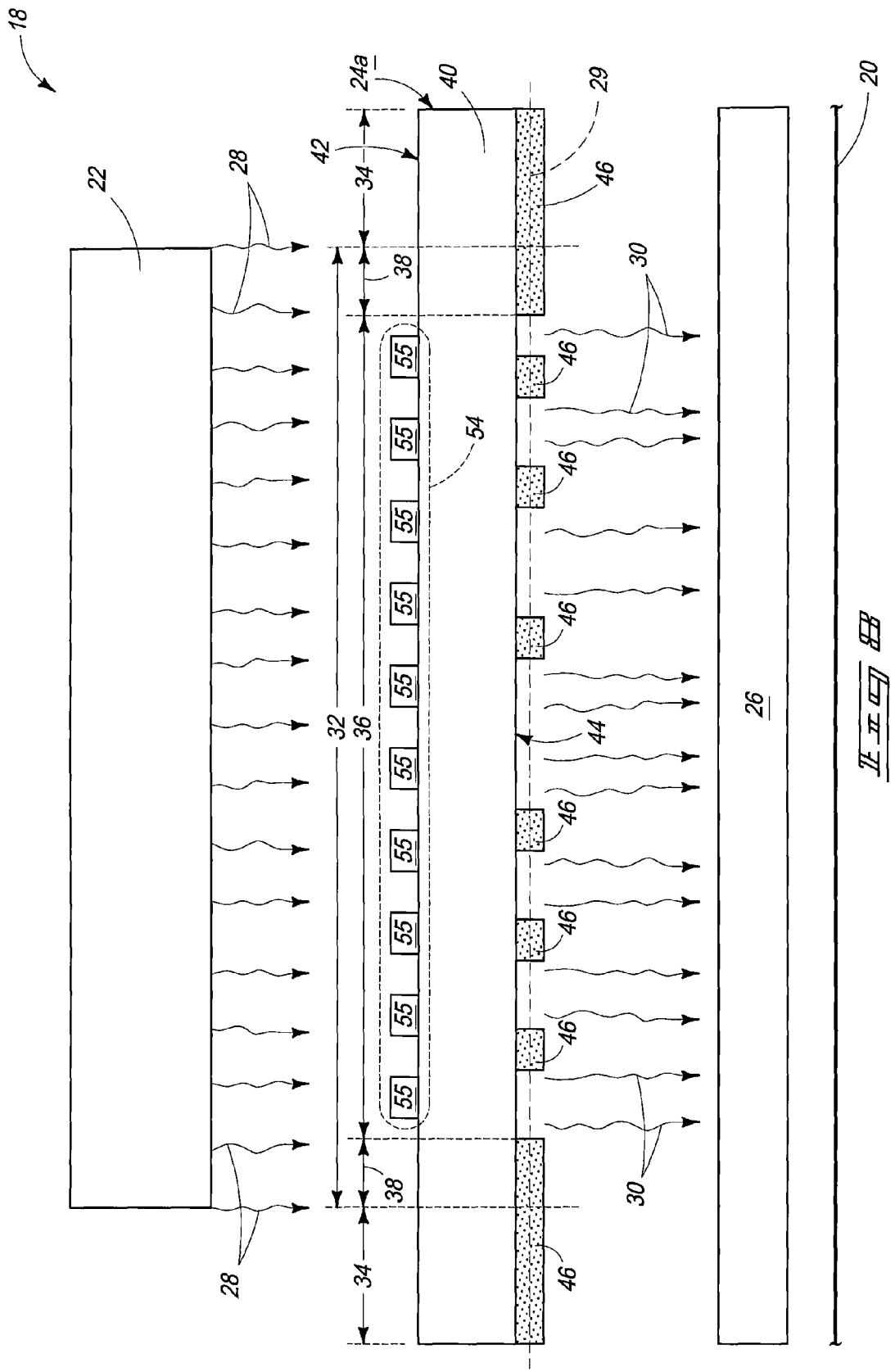
FIG. 8 is a diagrammatic sectional view of the FIG. 4 apparatus incorporating another embodiment reticle in accordance with the invention.

Referring to FIG. 8, an alternate embodiment reticle 24a is shown which has been fabricated to include non-printing features within a non-printing region of the reticle which generate additional hot spot locations on the lens. Like numerals from the above-described embodiments have been utilized where appropriate, with construction differences being indicated with the suffix "a" or with different numerals. FIG. 8 depicts an example embodiment wherein the non-printing region within which the non-printing features are received is on a side of the reticle upon which incident radiation is projected. For example, reticle 24a comprises a non-printing region 54 outside of focal plane 29. Such is formed to include projections 55 which project from side surface 42 of radiation transmissive core 40. In one embodiment, projections 55 may comprise opaque material. Regardless, the non-printing features of reticle 24a may be considered as projections 55 or as space between immediately adjacent of projections 55. In one embodiment, the non-printing features comprise straight walls that are orthogonal to the bulk of transmissive core 40.

Figure 9:
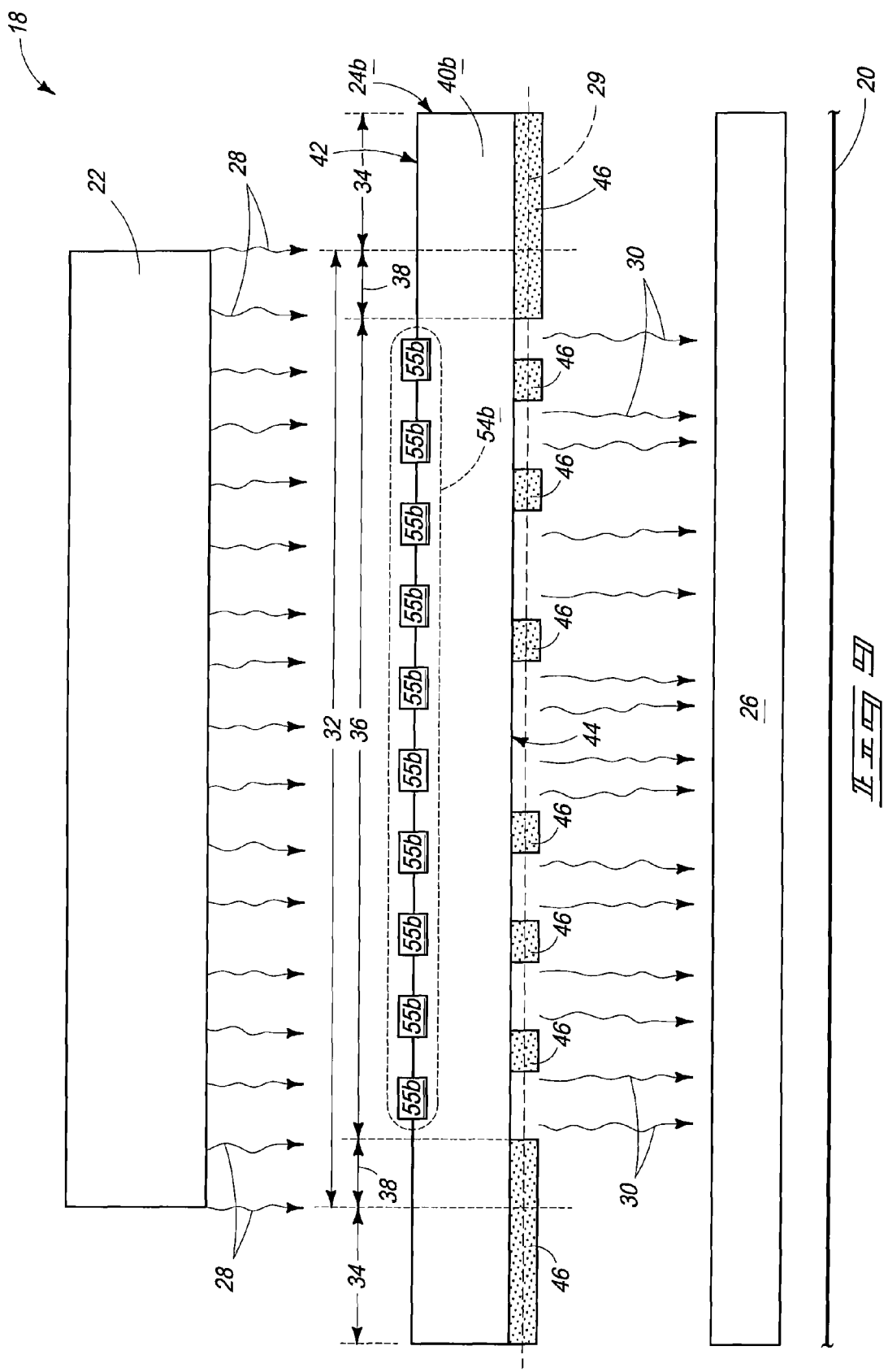
FIG. 9 is a diagrammatic sectional view of the FIG. 4 apparatus incorporating another embodiment reticle in accordance with the invention.

In one embodiment and as shown in FIG. 8, projections 55 are of a material that adheres to side surface 42 of radiation transmissive core 40 and are not received internally within radiation transmissive core 40. FIG. 9 depicts an alternate example embodiment reticle 24b wherein projections 55b of non-printing region 54b are of a material that is also received internally with radiation transmissive core 40. Like numerals from the above-described embodiments have been utilized where appropriate, with construction differences being indicated with the suffix "b".

Figure 10:
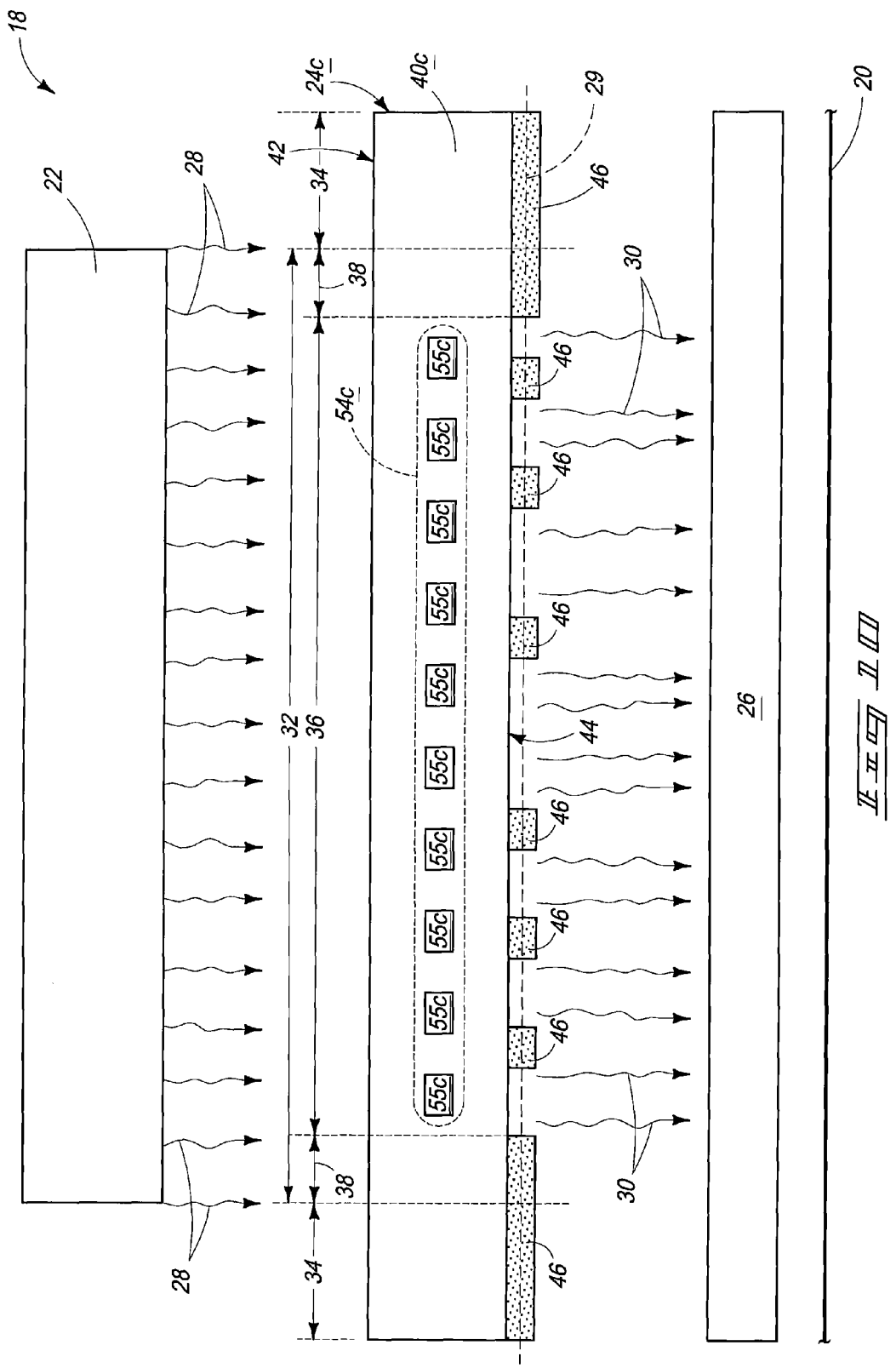
FIG. 10 is a diagrammatic sectional view of the FIG. 4 apparatus incorporating another embodiment reticle in accordance with the invention.

FIG. 10 depicts yet another alternate embodiment reticle 24c. Like numerals from the above-described embodiments have been utilized where appropriate, with construction differences being indicated with the suffix "c". With reticle 24c, the non-printing features have been formed within non-printing region 54c using material 55c which is received internally within radiation transmissive core 40c and which is everywhere spaced from incident radiation side 42 and emitted radiation side 44 of transmissive core 40c. Thickness of the transmissive core may or may not be increased, with increased thickness being shown in FIG. 10.

Aspects of the FIGS. 8-10 embodiments could also be combined (not shown).

Figure 11:
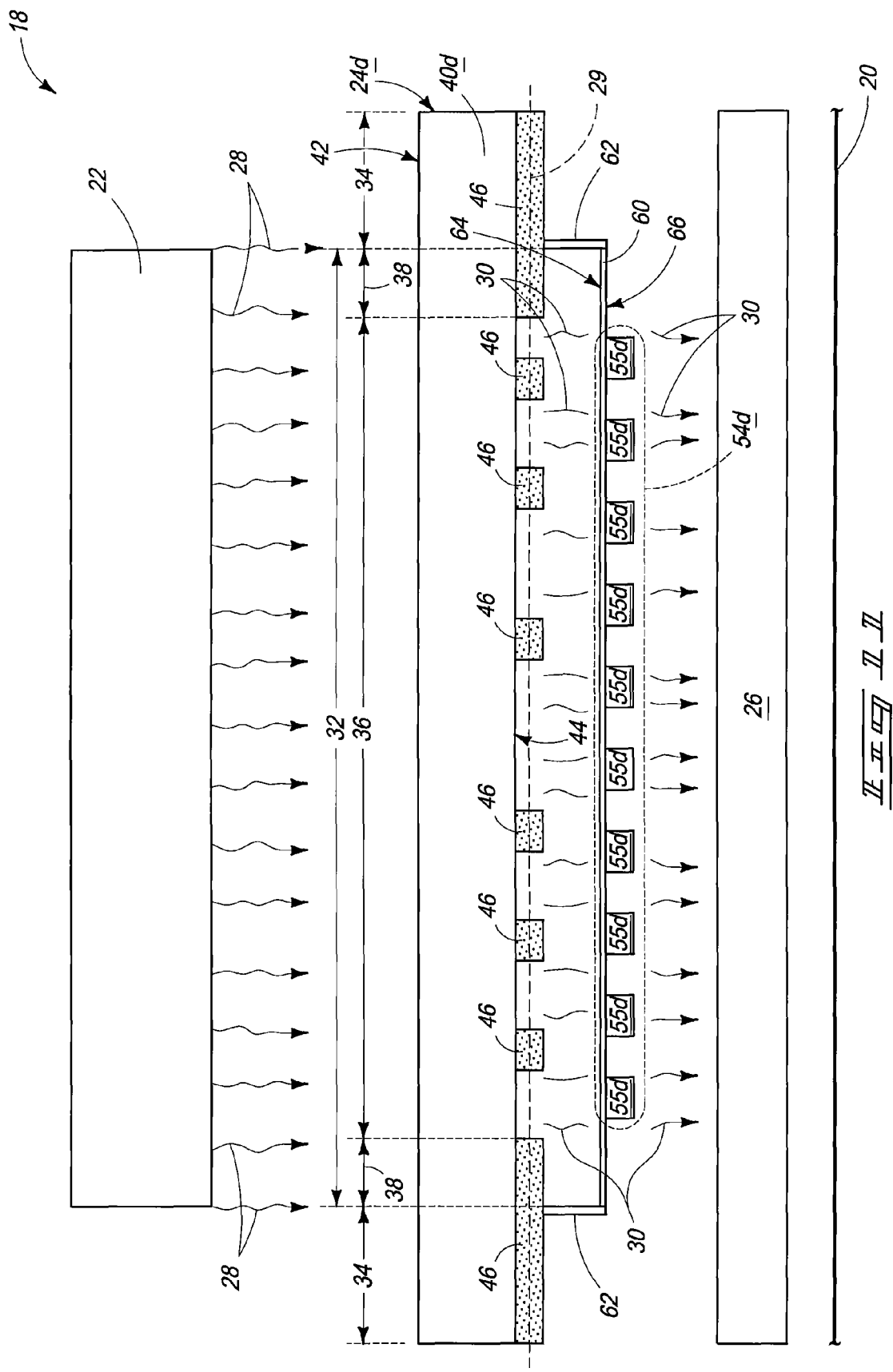
FIG. 11 is a diagrammatic sectional view of the FIG. 4 apparatus incorporating another embodiment reticle in accordance with the invention.

In the FIGS. 8-10 embodiments, the non-printing region within which the non-printing features were received was on or more proximate the incident radiation side, relative to focal plane 29, of each of the reticles. FIGS. 11-13 depict alternate example embodiments wherein the non-printing region within which the non-printing features are received is on or more proximate the side of the reticle from which radiation is emitted.

Referring first to FIG. 11, an alternate embodiment reticle 24d is shown which includes non-printing features within a non-printing region to generate additional hot spot locations on the lens. Like numerals from the above-described embodiments are used where appropriate, with construction differences being indicated with the suffix "d" or with different numerals. Reticle 24d includes a pellicle 60 having an incoming radiation side 64 and an outgoing radiation side 66. Pellicle 60 is shown supported by an example pellicle frame 62 received peripherally immediately outside of reticle field area 32. Non-printing features received within a non-printing region 54d comprise a portion of pellicle 60. Such may be formed, by way of example and as shown, with projections 55d received on outgoing radiation side 66 of pellicle 60. Again, the non-printing features within non-printing region 54d fabricated using material 55d may be blocks of material 55d or the space between immediately adjacent of blocks of material 55d.

FIG. 12 depicts an alternate example embodiment reticle 24e. Like numerals from the above-described embodiments are used where appropriate, with construction differences being indicated with the suffix "e". With reticle 24e, the non-printing features within non-printing region 54e are formed on incoming radiation side 64e. FIG. 13 depicts an alternate example reticle 24f wherein non-printing features have been formed within a non-printing region 54f using projections 55f formed on both of incoming radiation side 64f and outgoing radiation side 66f. Additionally or alternatively, pellicle 60 may be considered as comprising a radiation transmissive core material, with the non-printing features being formed of material received at least partially within the radiation transmissive core, for example analogous to the non-printing features shown in either of FIGS. 9 and 10.

Multiple non-printing regions having the above-exemplified non-printing features may also be fabricated, for example, combining different aspects of any of the above-described embodiments. Further and regardless, the reticles of the embodiments of FIGS. 4-10 would also likely comprise a pellicle, but such was not shown or described with respect to such embodiments as not being material to the initial disclosure with respect to FIGS. 4-10.

In the embodiments of FIGS. 8-13 where the non-printing region within which the subject non-printing features are received is outside of the reticle focal plane, the non-printing features provided there-within do not resolve upon the substrate being patterned the result of effectively being out of focus. Accordingly, the non-printing features there-within may or may not be sub-resolution in size if such were received within the focal plane in the live pattern area. In one embodiment, the non-printing features are of a sub-resolution size if such were received within the focal plane in the live pattern area. In one embodiment, the non-printing features are of a size which would print on the substrate if such were received within the focal plane in the live pattern area.

Embodiments of the invention encompass reticles which may or may not generate hot spot locations on a lens of an optic system with which the reticle is used. In one embodiment, a reticle comprises a focal plane and a reticle field area within the reticle focal plane upon which incident radiation is projected. The reticle field area comprises a live pattern area within the reticle focal plane from which patterned radiation is emitted. The reticle field area comprises a non-printing border area within the reticle focal plane upon which incident radiation is projected, with the non-printing border area being transmissive of some of the incident radiation. Patterned non-printing features are received within the non-printing border area. In one embodiment, the non-printing features are sized, shaped, and positioned to generate hot spot locations on a lens of an optic system with which the reticle is used, and in one embodiment to generate such hot spot locations on the lens within areas which contribute to more uniform heat distribution across the lens. Embodiments as described above in connection with FIGS. 6 and 7 are example such embodiments. Other attributes as described above may be incorporated in such reticle embodiments.

In one embodiment, a reticle comprises a focal plane within which a plurality of printing features is received. The reticle includes a reticle field area within the reticle focal plane upon which incident radiation is projected. The reticle field area comprises a live pattern area within which the plurality of printing features are received within the reticle focal plane and from which patterned radiation is emitted. Such a reticle also comprises a non-printing region outside of the focal plane and over the reticle field area, with the non-printing region comprising patterned non-printing features therein. In the context of this document, "over" the reticle field area is intended to be generic as to whether such is received elevationally under or elevationally over. In one embodiment, the non-printing features are sized, shaped, and positioned to generate hot spot locations on a lens of an optic system with which the reticle is used, and in one embodiment to generate such locations within areas which contribute to more uniform heat distribution across the lens. Example embodiments include those described above in connection with FIGS. 8-13. Additional attributes with respect to any reticle may also be incorporated in such embodiment as described above.

In one embodiment, a reticle comprises a focal plane within which a plurality of printing features is received. A pellicle is spaced from the focal plane and comprises patterned non-printing features. In one embodiment, the non-printing features are sized, shaped, and positioned to generate hot spot locations on a lens of an optic system with which the reticle is used, and in one embodiment to generate such locations on the lens within areas which contribute to more uniform heat distribution across the lens. FIGS. 11-13 above and the description pertaining thereto are example such embodiments. Any other attributes of reticles as disclosed herein may be used in this embodiment.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of mitigating asymmetric lens heating in photolithography, comprising:
   determining where first hot spot locations are expected to occur on a lens when using a reticle to photo-pattern a substrate; and
   fabricating the reticle to include non-printing features within a non-printing region of the reticle, where these non-printing features generate additional hot spot locations on the lens when using the reticle to photo-pattern the substrate.

2. The method of claim 1 wherein the additional hot spot locations, which mitigate asymmetric lens heating, are spaced from the first hot spot locations.

3. The method of claim 1 wherein the reticle comprises a focal plane and a reticle field area within the reticle focal plane upon which incident radiation is projected, the reticle field area comprising a live pattern area within the reticle focal plane from which patterned radiation is emitted to print features on the substrate, the reticle field area further comprising a border area within the reticle focal plane upon which the incident radiation is projected and the border area comprises said non-printing region of the reticle, and the method comprising:
   fabricating the non-printing features within said border area within the reticle focal plane.

4. The method of claim 3 wherein the border area surrounds the live pattern area and the non-printing features within the border area surround the live pattern area.

5. The method of claim 3 wherein the non-printing features are substantially transparent to the incident radiation, the border area being substantially opaque to the incident radiation except for the non-printing substantially transparent features, which allow the incident radiation to pass therethrough.

6. The method of claim 3 wherein the non-printing features are substantially opaque to the incident radiation.

7. The method of claim 1 wherein the reticle comprises a focal plane, said non-printing region being outside of the reticle focal plane and within which the non-printing features are fabricated.

8. The method of claim 7 wherein closest surfaces of material, from which the non-printing features are fabricated, are spaced at least 0.75 micron perpendicularly away from the reticle focal plane.

9. The method of claim 8 wherein the closest surfaces of the material, from which the non-printing features are fabricated, are spaced at least 1.0 micron perpendicularly away from the reticle focal plane.

10. The method of claim 7 wherein the non-printing features are of sub-resolution size when they are positioned within the focal plane in a live pattern area on the reticle.

11. The method of claim 7 wherein the non-printing features have a printable size which would print on the substrate when they are positioned within the focal plane in a live pattern area on the reticle.

12. The method of claim 8 wherein the non-printing region is on or proximate to a side of the reticle upon which incident radiation is projected.

13. The method of claim 12 wherein the reticle comprises a radiation transmissive core, the non-printing features being formed with projections from a surface of the radiation transmissive core.

14. The method of claim 13 wherein the projections are of a material that adheres to the surface and the material is not within the radiation transmissive core.

15. The method of claim 13 wherein the projections are of a material that is also received internally within the radiation transmissive core.

16. The method of claim 12 wherein the reticle comprises a radiation transmissive core having opposing incident and emitted radiation sides, the non-printing features being formed with substantially opaque material which is received internally within the radiation transmissive core and the substantially opaque material is everywhere spaced from the incident radiation side and the emitted radiation side of the transmissive core.

17. The method of claim 7 wherein the non-printing region is on or proximate to a side of the reticle from which radiation is emitted.

18. The method of claim 17 wherein the reticle comprises a pellicle, the non-printing features comprising a portion of the pellicle.

19. The method of claim 18 wherein the non-printing features are formed on a side of the pellicle upon which incoming radiation is projected.

20. The method of claim 18 wherein the non-printing features are formed on a side of the pellicle from which outgoing radiation is emitted.

21. The method of claim 18 wherein the pellicle has an incoming radiation side and an outgoing radiation side, the non-printing features being formed on both of the incoming radiation side and the outgoing radiation side.

22. The method of claim 18 wherein the pellicle comprises radiation transmissive core material.

23. The method of claim 1 wherein the reticle comprises a focal plane and a reticle field area within the focal plane upon which incident radiation is projected, the reticle field area comprising a live pattern area within the focal plane from which patterned radiation is emitted to print features on the substrate, the reticle field area further comprising a border area within the focal plane upon which the incident radiation is projected, the border area comprising said non-printing region of the reticle, another non-printing region of the reticle being outside of the focal plane; and fabricating the non-printing features within said border area within the focal plane and those within said another non-printing region outside of the focal plane.

24. The method of claim 1 wherein the reticle is a dark field reticle, and the fabricating forms the non-printing features to comprise openings through opaque material.

* * * * *